United States Patent
Beierlein et al.

(10) Patent No.: US 6,501,217 B2
(45) Date of Patent: *Dec. 31, 2002

(54) ANODE MODIFICATION FOR ORGANIC LIGHT EMITTING DIODES

(75) Inventors: Tilman A. Beierlein, Kilchberg; Eliav Haskal, Zurich; Heike Riel, Rueschlikon; Walter Riess, Adliswil; Paul Seidler, Gattikon; Samuel Clagett Strite, Adliswil, all of (CH); Horst Vestweber, Winterscheid (DE)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/381,648

(22) PCT Filed: Feb. 2, 1998

(86) PCT No.: PCT/IB98/00124

§ 371 (c)(1),
(2), (4) Date: Jan. 10, 2000

(87) PCT Pub. No.: WO99/39393

PCT Pub. Date: Aug. 5, 1999

(65) Prior Publication Data

US 2002/0117962 A1 Aug. 29, 2002

(51) Int. Cl.[7] .............................................. H05B 33/26

(52) U.S. Cl. ........................................ 313/504; 313/503

(58) Field of Search ................................. 313/503, 504, 313/506, 509; 257/40, 103; 428/917; 427/66

(56) References Cited

U.S. PATENT DOCUMENTS

| 5,619,058 A | * | 4/1997 | Kim .............................. 257/40 |
| 5,714,838 A | * | 2/1998 | Haight et al. ................ 313/304 |
| 5,739,545 A | * | 4/1998 | Guha et al. ................... 257/40 |
| 5,949,186 A | * | 9/1999 | Nagayama et al. ......... 313/504 |
| 5,969,474 A | * | 10/1999 | Arai ............................. 313/504 |
| 6,121,727 A | * | 9/2000 | Kanai et al. ................. 313/504 |

FOREIGN PATENT DOCUMENTS

| CH | WO97/20355 | 6/1997 | .......... H01L/51/20 |
| EP | 0668620 | 8/1995 | .......... H01L/51/00 |
| JP | 04-254887 | 9/1992 | .............. G09F/9/30 |
| JP | 05-021165 | 1/1993 | .......... H05B/33/26 |
| JP | 06-290873 | 10/1994 | .......... H05B/33/14 |
| JP | 07-106066 | 4/1995 | .......... H05B/33/22 |
| JP | 07-263742 | 10/1995 | .......... H01L/33/00 |
| JP | 08-288069 | 11/1996 | .......... H05B/33/22 |
| JP | 09-063771 | 3/1997 | .......... H05B/33/26 |
| WO | WO97/47050 | 12/1997 | .......... H01L/33/00 |
| WO | WO97/47051 | 12/1997 | .......... H01L/51/20 |

OTHER PUBLICATIONS

W. Helfrich et al., "Recombination Radiation in Anthracene Crystals", Physical Review Letters, vol. 14, No. 7, pp. 229–231, Feb. 15, 1965.

C.W. Tang et al., "Organic Electroluminescent Diodes", Applied Physics Letters, vol. 51, No. 12, pp. 913–915 Sep. 21, 1987.

(List continued on next page.)

Primary Examiner—Michael H. Day
(74) Attorney, Agent, or Firm—Marian Underweiser

(57) ABSTRACT

An organic light emitting device is provided which includes a cathode (51), an anode (47, 46, 48), and an organic electroluminescent region (49, 50). The anode includes a metal layer (46), a barrier layer (47), and an anode modification layer (48). Light is emitted through the cathode (51) when a voltage is applied between the anode (47, 46, 48) and the cathode (51).

34 Claims, 5 Drawing Sheets

OTHER PUBLICATIONS

J. H. Burroughes et al., "Light–Emitting Diodes Based On Conjugated Polymers", Nature, vol. 347, pp. 539–541, Oct. 11, 1990.

N. Greenham et al., "Efficient Light–Emitting Diodes Based On Ploymers With High Electron Affinites", Nature, vol. 365, pp. 628–630, Oct. 14, 1993.

D.D.C. Bradley, "Conjugated Polymer Electroluminescence", Synthetic Metals, vol. 54, pp. 401–415, 1993. (no month).

J. Peng et al., "The Effect Of A Metal Electrode On The Electroluminescence Of Poly (p–phenylenevinylene)", Japanese Journal Of Applied Physics, vol. 35, No. 3A, pp. L317–L319, Mar. 1, 1996.

I.D. Parker, "Carrier Tunneling And Device Characteristics In Polymer Light–Emitting Diodes", Journal Of Applied Physics, vol. 75, No. 3, pp. 1656–1666, Feb. 1, 1994.

C.W. Tang et al., "Electroluminescence of Doperd Organic Thin Films", Journal ) Of Applied Physics, vol. 65, No. 9, pp. 3610–3616, May 1, 1989.

S. Egusa et al., "Carrier Injection Characteristics Of Organic Electroluminescent Devices", Japanese Journal Of Applied Physics, vol. 33, No. 5A, pp. 2741–2745, May 1994.

G. Sauer et al., "Characterization Of Polymeric Light–Emitting Diodes By SIMS Depth Profiling Analysis", Fresenius' Journal of Analytical Chemistry, vol. 353, pp. 642–646, Nov./Dec. 1995.

J.C. Scott, J. H. Kaufman, P.J. Brock, R. DiPietro, J. Salem and A.A. Goita, "Degradation And Failure of MEH–PPV Light–Emitting Diodes", J. Appl. Phys., vol. 79, pp. 2745–2751, Mar. 1, 1996.

V. Bulovi et al., "Transparent Light–Emitting Devices", Nature, vol. 380, No. 10, p. 29, Mar. 7, 1996.

I. D Parker and H. Kim, "Fabrication of Polymer Light–Emitting Diodes Using Doped Silicon Electrodes", Applied Physics Letters, vol. 64, No. 14, pp. 1774–1776, Apr. 4, 1994.

T. Beierlein et al., "Properties Of InGaN Deposited On Glass At Low Temperature", Materials Research Society Internet Journal Of Nitride Semiconductor Research (http://nsr, mij.mrs.org/2/29/complete.html) vol. 2, Article 29. (no date).

C. Hosokawa and T. Kusumoto, "Blue Electroluminescence From Multilayer Devices With Distyrylarylene" in International Symposium On Inorganic And Organic Electroluminescence, Hamamatsu, pp. 42–47, Oct. 5–6, 1994.

T. Wakimoto et al., "Organic EL Cells With High Luminous Efficiency", International Symposium On Inorganic And Organic Electroluminescence, Hamamtsu, pp. 77–79, Oct. 5–6, 1994.

C. Tang, "An Overview Of Organic Electroluminescent Materials And Devices", SID Conference San Diego, SID Digest Proceedings, pp. 181–184, 1996 (no month).

E. Staring et al., "Polymer LED's: Materials And Devices", in International Symposium On Inorganic And Organic Electroluminescence, pp. 48–53, Hamamatsu, 1994 (no month).

C. Adachi et al., "Molecular Design Of Hole Transport Materials For Obtaining High Durability In Inorganic Electroluminescent Diodes", Applied Physics Letters, vol. 66, pp. 2679–2681, May 15, 1995.

Y. Kuwabara et al., "Thermally Stable Multilayered Organic Electroluninescent Devices Using Novel Starburst Molecules, 4,4',4"– Tri(N–carbazolyl) triphenylamine (TCTA) and 4,4', 4"– Tris(3–methylphenylphenylamino) triphenylamine (m–MTDATA), as Hole–Transport Materials", Advanced Materials, 6, No. 9, pp. 677–679, 1994 (no month).

Y. Shirota et al., "Multilayered Organic Electroluminescence Device Using A Novel Starburst Molecule, 4–4'-4"–tris (3methylphenylphenylamino) triphenylamine, as a hole transport material", Applied Physics Letters, vol. 65, No. 7, pp. 807–809, Aug. 15, 1994.

* cited by examiner

ANODE MODIFICATION FOR ORGANIC LIGHT EMITTING DIODES

TECHNICAL FIELD

The present invention pertains to organic electroluminescent displays and methods for making the same.

BACKGROUND OF THE INVENTION

Organic electroluminescence (EL) has been studied extensively because of its possible applications in discrete light emitting diodes (LED), arrays and displays. Organic materials can potentially replace semiconductors in many LED applications and enable wholly new applications. The ease of organic LED (OLED) fabrication and the continuing development of improved organic materials promise novel and inexpensive OLED display possibilities.

Organic EL at low efficiency was reported many years ago in e.g. Helfrich et al., Physical Review Letters, Vol. 14, No. 7, 1965, pp. 229–231. Recent developments have been spurred by two reports of efficient organic EL: C. W. Tang et al., Applied Physics Letters, Vol. 51, No. 12, 1987, pp. 913–915, and Burroughes et al., Nature, Vol. 347, 1990, pp. 539. Tang used vacuum deposition of molecular compounds to form OLEDs with two organic layers. Burroughes spin coated a polymer, poly(p-phenylenevinylene), to form a single-organic-layer OLED. The advances described by Tang and in subsequent work by N. Greenham et al., Nature, Vol. 365, 1993, pp. 628–630, were achieved mainly through improvements in OLED design derived from the selection of appropriate organic multilayers and electrode metals.

The simplest possible OLED structure, depicted in FIG. 1A, consists of an organic emission layer 10 sandwiched between cathode 11 and anode 12 electrodes which inject electrons ($e^-$) and holes ($h^+$), respectively, which meet in the emission layer 10 and recombine producing light. It has been shown (D. D. C. Bradley, Synthetic Metals, Vol. 54, 1993, pp. 401–405, J. Peng et al., Japanese Journal of Applied Physics, Vol. 35, No. 3A, 1996, pp. L317–L319, and I. D. Parker, Journal of Applied Physics, Vol. 75, No. 3, 1994, pp. 1656–1666) that improved performance is achieved if the electrode work functions match the respective molecular orbitals (MO) of the organic layer 10. Such an improved structure is shown in FIG. 1B where optimized electrode materials 13 and 14 reduce the energy barriers to carrier injection into the organic layer 10. Still, single organic layer structures perform poorly because electrons can traverse the organic layer 10 reaching the anode 14, or holes may reach the cathode 13, in either case resulting in current without light, and lower OLED efficiency.

Balanced charge injection is also important. For example, an excellent anode is of limited use if the cathode has a large energy barrier to electron injection. FIG. 2 illustrates a device with a large electron barrier 16 such that few electrons are injected, leaving the holes no option but to recombine non-radiatively in or near the cathode 15. The anode and cathode materials should be evenly matched to their respective MOs to provide balanced charge injection and optimized OLED efficiency.

An improved structure in which the electron and hole transport functions are divided between separate organic layers, an electron transport layer 20 (ETL) and a hole transport layer (HTL) 21, is shown in FIG. 3. In C. W. Tang et al., Journal of Applied Physics, Vol. 65, No. 9, 1989; pp. 3610–3616, it is described that higher carrier mobility is achieved in a two organic layer OLED design, and this led to reduced OLED series resistance enabling equal light output at lower operating voltage. The electrodes 22, 23 can be chosen individually to match to the ETL 20 and HTL 21 MOs, respectively, while recombination occurs at the interface 24 of organic layers 20 and 21, far from either electrode. As electrodes, Tang used a MgAg alloy cathode and transparent Indium-Tin-Oxide (ITO) deposited on a glass substrate as the anode. Egusa et al. in Japanese Journal of Applied Physics, Vol. 33, No. 5A, 1994, pp. 2741–2745 have shown that proper selection of the organic multilayer materials leads to energy barriers blocking both electrons and holes at the organic interface. This is illustrated in FIG. 3 in which electrons are blocked from entering the HTL 21 and holes from entering the ETL 20 by a clever choice of organic materials. This feature reduces quenching near the contacts (as illustrated in FIG. 2) and also promotes a high density of electrons and holes in the small interface volume providing enhanced radiative recombination.

With multilayer device architectures now well understood and widely used, a remaining performance limitation of OLEDs is the electrodes. The main figure of merit for electrode materials is the position of the electrode Fermi energy relative to the relevant organic MO. In some applications it is also desirable for an electrode to be either transparent or highly reflective to assist light extraction. Electrodes must also be chemically inert with respect to the adjacent organic material to provide long term OLED stability.

Much attention has been paid to the cathode, largely because good electron injectors are low work function metals which are. also chemically reactive and oxidize quickly in atmosphere, limiting the OLED reliability and lifetime. Much less attention has been paid to the optimization of the anode contact, since conventional ITO anodes generally outperform the cathode contact leading to an excess of holes. Due to this excess, and the convenience associated with the transparency of ITO, improved anodes have not been as actively sought as improved cathodes.

ITO is by no means an ideal anode, however. ITO is responsible for device degradation as a result of In diffusion into the OLED eventually causing short circuits as identified by G. Sauer et al., Fresenius J. Anal. Chem., pp. 642–646, Vol. 353 (1995). ITO is polycrystalline and its abundance of grain boundaries provides ample pathways for contaminant diffusion into the OLED. Finally, ITO is a reservoir of oxygen which is known to have a detrimental effect on many organic materials (see J. C. Scott, J. H. Kaufman, P. J. Brock, R. DiPietro, J. Salem, and J. A. Goita, J. Appl. Phys., Vol. 79, p. 2745, 1996). Despite all of these problems, ITO anodes are favored because no better transparent electrode material is known and ITO provides adequate stability for many applications.

While conventional OLEDs extract light through the ITO anode, architectures relying on light extraction through a highly transparent cathode (TC) are desirable for transparent OLEDs or OLEDs fabricated on an opaque substrate. Si is an especially desirable OLED substrate because circuits fabricated in the Si wafer can be cheaply integrated with drive circuitry providing display functions. Given the minaturization and outstanding performance of Si circuitry, a high information content OLED/Si display could be inexpensively fabricated on a Si integrated circuit (IC).

The simplest approach incorporating a TC is to deposit a thin, semi-transparent low work function metal layer, e.g. Ca or MgAg, followed by ITO or another transparent, conducting material or materials, e.g. as reported in Bulovic et al., Nature, Vol. 380, No. 10, 1996 p. 29, or in the co-pending PCT patent application PCT/IB96/00557, published on Dec. 11, 1997 (publication number WO97/47050). To maximize the efficiency of such a TC OLED, a highly reflective anode which can direct more light out through the TC is desired. Consequently, the low reflectivity of ITO is a disadvantage in TC OLEDs.

Alternatively, for some applications it may be more important to increase the contrast ratio of the OLEDs or display based thereon. In this case, a TC OLED could benefit from a non-reflective, highly absorbing anode. Again the optical characteristics of ITO are a disadvantage.

High work function metals could form highly reflective anodes for TC OLEDs. Some of these metals, e.g. Au, have a larger work function than ITO (5.2 eV vs. 4.7 eV), but lifetime may be compromised because of high diffusivity in organic materials. Like In from ITO, only worse, Au diffuses easily through many organic materials and can eventually short circuit the device.

Efforts have been made to fabricate OLEDs on Si substrates (Parker and Kim, Applied Physics Letters, Vol. 64, No. 14, 1994, pp. 1774–1776). Si, due to its small bandgap and moderate work function, has a large barrier for both electron and hole injection into organic MOs, and therefore performs poorly as an electrode. Parker and Kim improved the situation somewhat by adding a $SiO_2$ interlayer between the Si and OLED. A voltage drop across the $SiO_2$ insulator permitted the Si bands to line up with their organic MO counterpart and electrons or holes from the Si to tunnel through the $SiO_2$ into the organic MO. However, the required voltage drop across the $SiO_2$ raised the OLED turn-on voltage >10 V, making these OLEDs inefficient. Low voltage OLED/Si designs are desirable not just to improve efficiency, but also to facilitate circuit design since sub-micron Si transistors cannot easily produce drive voltages >10 V. For anodes, more desirable than a tunneling insulator surface modification like $SiO_2$ is one which raises the Si surface work function thereby lowering the OLED operating voltage.

As can be seen from the above examples and description of the state of the art, electrode materials must be improved to realize OLEDs, and displays based thereon, with superior reliability and efficiency, and to enable novel architectures, such as devices emitting through a TC. In particular, to fabricate an OLED array or display on a Si substrate, an improved anode compatible with Si IC technology is required for optimized TC OLED architectures.

It is an object of the present invention to provide new and improved organic EL devices, arrays and displays based thereon.

It is a further purpose of the present invention to provide new and improved organic EL devices, arrays and displays based thereon optimized for light emission through a transparent cathode electrode with improved efficiency, lower operating voltage, or steeper current/voltage characteristic and increased reliability, stability and lifetime.

It is another object of the present invention to provide new and improved anodes for organic EL devices, arrays and displays fabricated on Si substrates.

It is a further object to provide a method for making the present new and improved organic EL devices, arrays and displays.

SUMMARY OF THE INVENTION

The above objects have been accomplished by providing an OLED having a cathode, an anode, and an organic region sandwiched in between, said anode being composed of a metal layer,
an anode modification layer, and
at least one barrier layer,
said anode being arranged such that said anode modification layer is in contact with said organic region and light is extracted through said cathode.

Any kind of metal is suited as metal layer in connection with the present invention. Examples are Al, Cu, Mo, Ti, Pt, Ir, Ni, Au, Ag, and any alloy thereof, or any metal stack such as Pt on Al and the like.

The inventive approach is specifically designed for the fabrication of OLEDs on top of Si, preferably Si crystalline wafers incorporating pre-processed integrated display circuitry (herein referred to as Si IC). The present invention is designed to modify the existing Si device metallization into a stable OLED anode having good hole injection properties. For OLEDs on top of a Si IC, the metal layer in the present invention is generally the final metallization layer of the Si IC process, which consistent with present Si technology is normally Al, Cu or an alloy thereof. Neither Al, Cu or Al:Cu alloys perform well as OLED anodes, but they do provide excellent visible spectrum reflectivity which increases the amount of light extracted through a TC. The Si IC metallization surface can vary widely in terms of oxide thickness, roughness and surface contaminants depending on numerous factors, including the fabrication process, the time between IC fabrication and OLED deposition, and the environment in which the Si IC was stored and shipped. For reproduceable fabrication of efficient OLEDs the Si metallization anode properties must be improved and effects arising from variations of the initial state of the metal surface must be eliminated.

The inventive approach is also suited for use with pixel and drive circuitry comprising polysilicon or amorphous silicon devices.

The anode modification layer in the present invention is mainly selected for its high work function which provides efficient hole injection into OLEDs. The anode modification layer must form a stable interface with the adjacent organic layer being part of the so-called organic region (e.g. the organic HTL) to insure consistent OLED performance over an extended time period. The anode modification layer can be conductive or insulating, but it should be sufficiently thin that it contributes negligibly both to the OLED series resistance and optical absorption losses. Oxides are well suited as anode modification layers. The thickness of the anode modification layer is preferably between 0.5 nm and 10 nm.

The barrier layer or layers in the present invention isolates the anode modification layer from the metal layer by forming a physical and chemical barrier, while permitting charge to pass freely through its interfaces with the metal layer and anode modification layer. The barrier layer(s) provides a consistent and reproduceable surface for the deposition or formation of the anode modification layer regardless of the metal layer composition or initial state of its surface. The barrier layer(s) can be conductive or insulating, but it (they) should be sufficiently thin that it (they) contributes negligibly to the OLED series resistance. Alternatively, the barrier layer(s) can be highly reflective which avoids absorption losses. The thickness of the barrier layer is preferably between 5 nm–100 nm. Well suited are barrier layers comprising TiN or TiNC, for example.

For formation on a Si wafer, all of the layers comprising the anode must be depositable or formable onto the wafer using processes sufficiently gentle that underlying Si circuitry is undamaged, i.e. at low temperature causing little chemical or physical damage.

In one embodiment of the present invention, a single or multilayer OLED structure having a TC fabricated on a Si substrate incorporates a multilayer anode structure comprising a metal layer, an anode modification layer, and an intermediate barrier layer(s), such that the anode is stable and efficient at hole injection.

The introduction of such an anode into the OLED structure leads to the following advantages:

Low voltage hole injection via both the high work function of the anode modification layer and the free passage of charge from the metal layer, through the barrier layer(s) into the anode modification layer.

Stable OLED operation over an extended time period via the chemical and physical barrier the barrier layer(s) provides between the metal layer and anode modification layer, and the stability of the anode modification layer interface with the adjacent organic HTL.

Efficient light extraction through the TC aided by the high reflectivity and low absorption of the metal layer, barrier layer(s) and anode modification layer stack.

DESCRIPTION OF THE DRAWINGS

The invention is described in detail below with reference to the following schematic drawings. It is to be noted that the Figures are not drawn to scale.

DESCRIPTION OF PREFERRED EMBODIMENTS

A first improved structure benefiting from the inventive anode approach is illustrated and discussed in connection with FIG. 4.

Figure 1A:
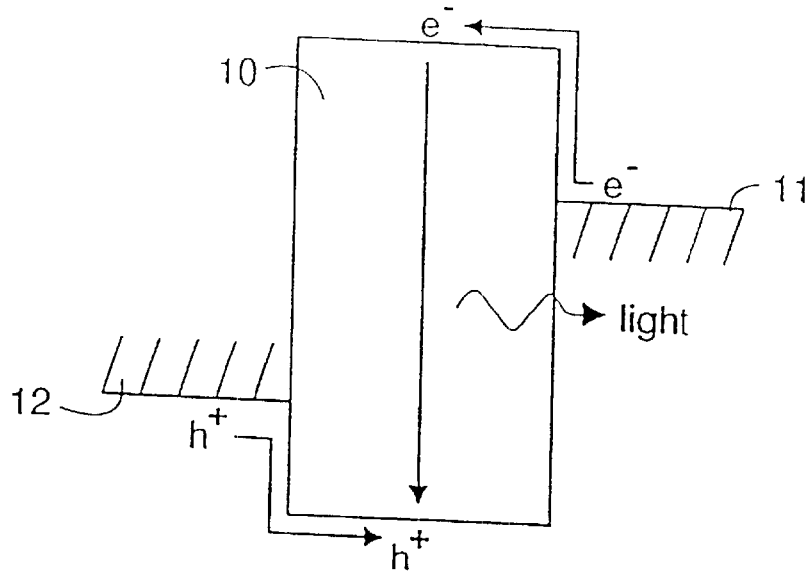
FIG. 1A shows the band structure of a known OLED having an emission layer and two electrodes (Prior Art).
Figure 1B:
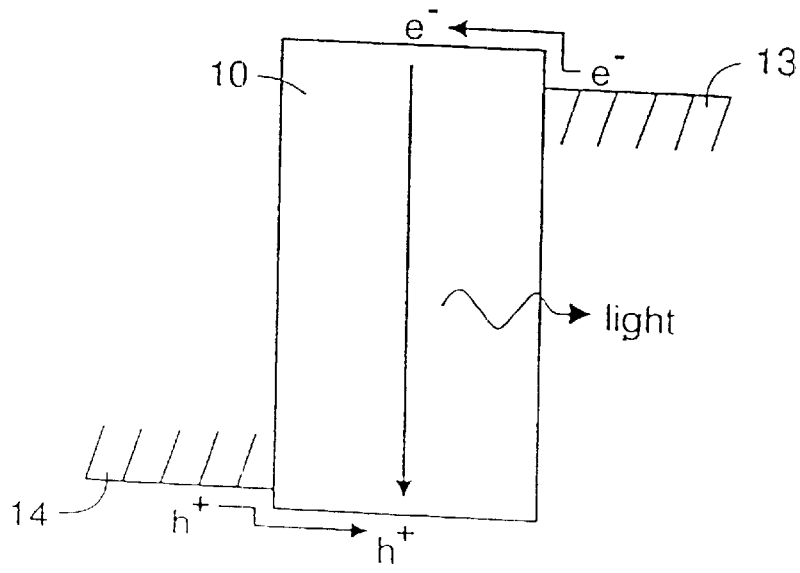
FIG. 1B shows the band structure of another known OLED having an emission layer and two metal electrodes, with work functions chosen such that the energy barrier for carrier injection is reduced (Prior Art).
Figure 2:
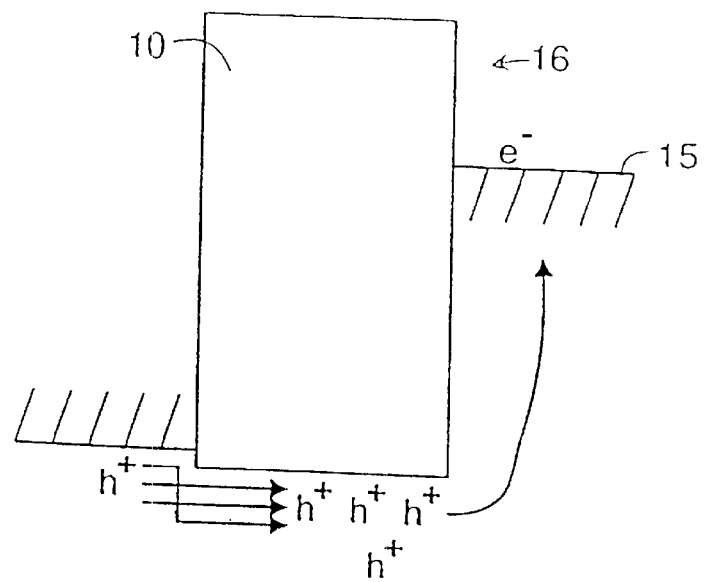
FIG. 2 shows the band structure of another known OLED having an emission layer and two metal electrodes, the work function of the anode being chosen such that the energy barrier for hole injection is low, whereas the work function of the cathode poorly matches the emission layer yielding little electron injection and little radiative recombination in said emission layer (Prior Art).
Figure 3:
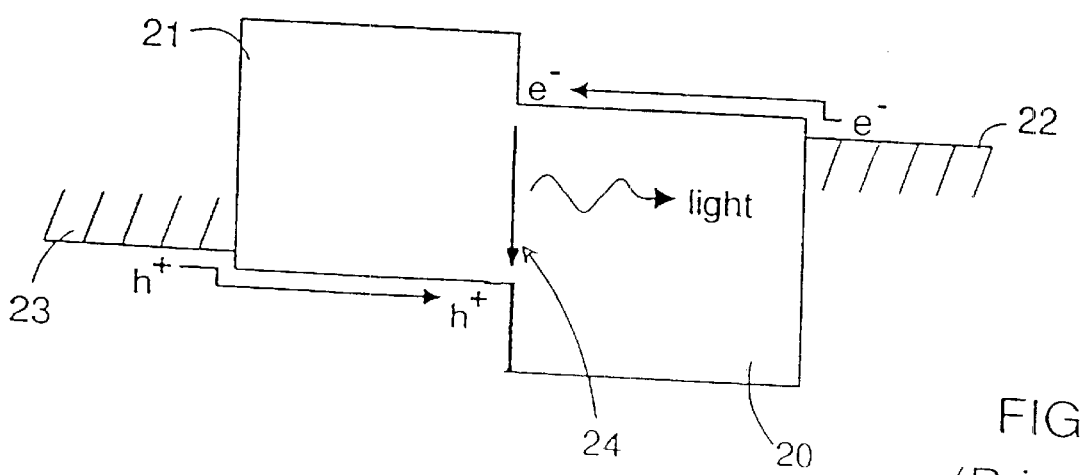
FIG. 3 shows the band structure of another known OLED having an electron transport layer and hole transport layer (Prior Art).
Figure 4:
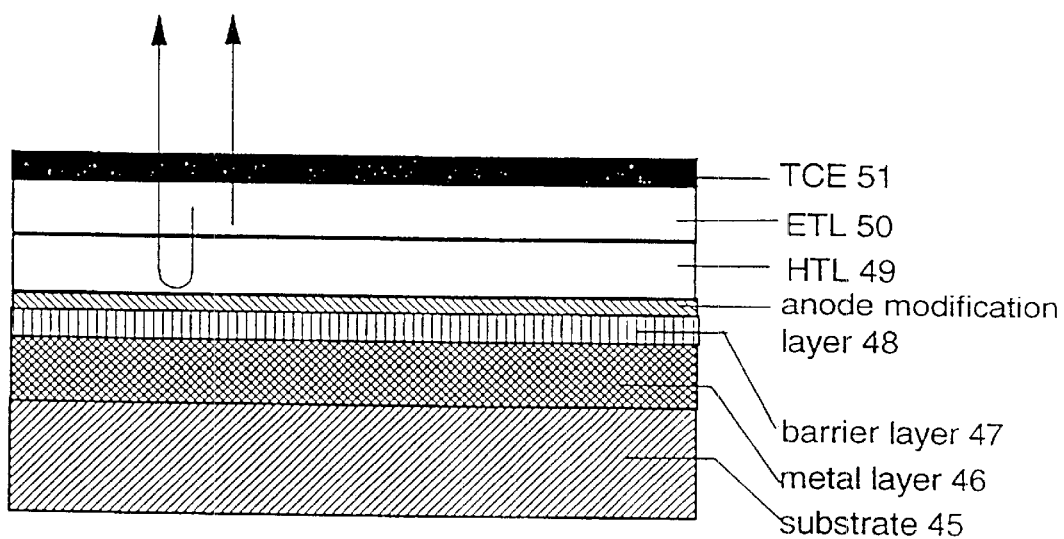
FIG. 4 is a schematic cross section of a first embodiment of the present invention.
Figure 5:
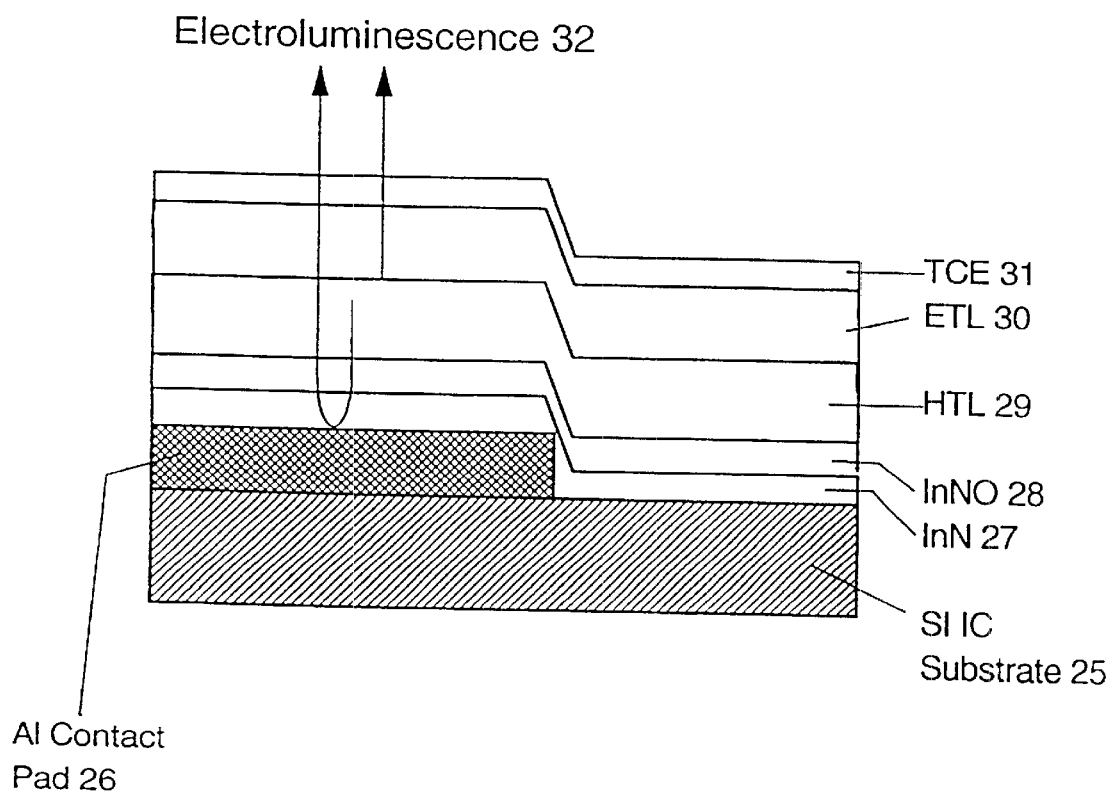
FIG. 5 is a schematic cross section of a second embodiment of the present invention.
Figure 6:
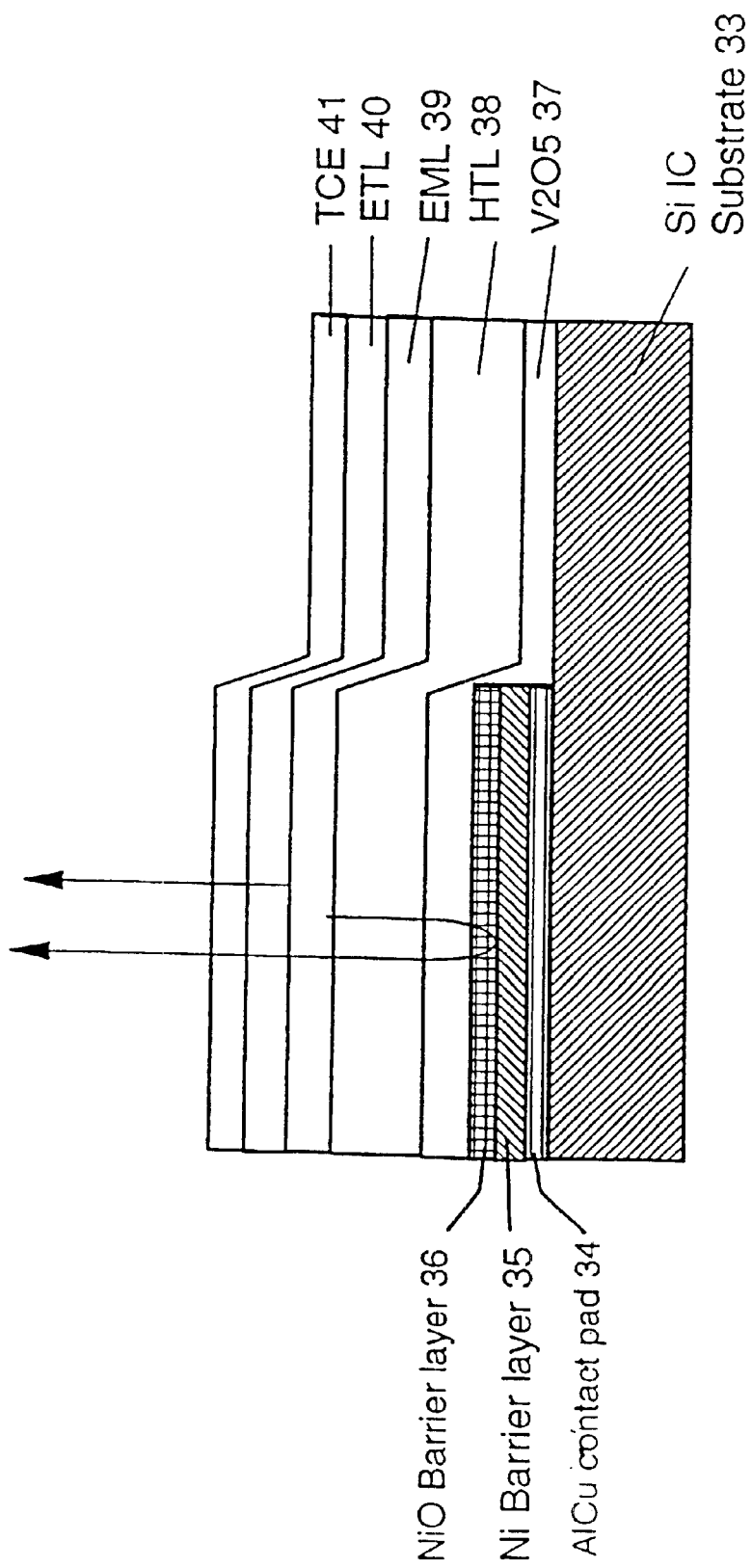
FIG. 6 is a schematic cross section of a third embodiment of the present invention.

To provide high performance TC OLED devices fabricated on Si substrates, improved structures benefiting from the inventive anode approach, as illustrated in FIGS. 4–6, are provided, enabling new array and display applications. Three embodiments of improved OLEDs incorporating the inventive anodes are detailed in connection with FIGS. 4–6.

A first embodiment is depicted in FIG. 4. A TC OLED is shown which is formed on a substrate 45. Since in the present configuration the electroluminescent light 52 is emitted through the top electrode (cathode 51), almost any kind of substrate 45 can be used. Examples are Si, glass, quartz, stainless steel, and various plastics. The inventive anode, comprising a metal layer 46, a barrier layer 47, and an anode modification layer 48 is situated on said substrate 45. Any kind of metal is suited as metal layer 46. Examples are Al, Cu, Mo, Ti, Pt, Ir, Ni, Au, Ag, and any alloy thereof, or any metal stack such as Pt on Al and the like. Depending on the embodiment, particularly well suited are metals which provide visible spectrum reflectivity.

The barrier layer 47 isolates the anode modification layer 48 from the metal layer 46 by forming a physical and chemical barrier, while permitting charge to pass freely through its interfaces with the metal layer 46 and anode modification layer 48. Note that the inventive anode might comprise one or more barrier layers. The barrier layer(s) 47 provides a consistent and reproduceable surface for the formation or deposition of the anode modification layer 48 regardless of the metal layer composition or initial state of its surface. The barrier layer(s) 47 can be conductive or insulating, but it (they) should be sufficiently thin that it (they) contributes negligibly to the OLED series resistance. Alternatively, the barrier layer(s) 47 can be reflective which avoids absorption losses. The thickness of the barrier layer is preferably between 5 nm–100 nm.

The anode modification layer 48 is mainly selected for its high work function which provides efficient hole injection into the organic region of the OLED. The anode modification layer 48 must form a stable interface with the adjacent organic emission layer (EML) 49 to insure. consistent OLED performance over an extended time period. The anode modification layer 48 can be conductive or insulating, but it must be sufficiently thin that it contributes negligibly to both the OLED series resistance and the optical absorption losses. The thickness of the anode modification layer is preferably between 0.5 nm and 10 nm.

A TC 51 is situated on the EML 49. The electroluminescence takes place within the EML 49. As indicated in FIG. 4, part of the light is emitted directly through the EML 49 and the TC 51 into the half space above the OLED. Another part of the light travels towards the inventive anode structure. The anode structure reflects the light such that it is also emitted into the half space above the OLED.

TABLE 1

Exemplary details of the first embodiment

| Layer | No. | Material | Thickness | present example |
|---|---|---|---|---|
| Substrate | 45 | Quartz | 0.05–5 mm | 800 μm |
| Metal Layer | 46 | Ti/Al | 0.01–0.7 μm/ 0.05–3 μm | 2 nm |
| Barrier Layer | 47 | Ni | 0.01–2 μm | 30 nm |
| Anode modification Layer | 48 | ITO | 0.003–2 μm | 7 nm |
| Emission Layer | 49 | PPV | 50–500 nm | 200 nm |
| Transparent Cathode | 51 | Li:Al alloy | 50–1000 nm | 120 nm |

A second embodiment of the inventive anode for TC OLEDs fabricated on Si substrates is depicted in FIG. 5. From the substrate 25 up, listed in the order of deposition, is a Si IC/InN/InNO$_x$/HTL/ETL/TC OLED structure. The Si IC 25 in FIG. 5 comprises an Al top metal contact pad 26 which also serves as the metal layer in the inventive anode. After completion of the Si IC fabrication, an InN barrier layer 27 is deposited directly onto the substrate such that it overlaps at least the contact pad 26. The sample is then oxidized in an oxygen plasma, or equivalently in an air, steam, ozone or other oxidizing environment to prepare an InNO$_x$ surface anode modification layer 28 capable of low voltage hole injection into the organic HTL 29. Electrons injected into the ETL 30 from the TC 31 recombine with the holes in the organic region producing EL 32 which is extracted through the TC 31. The organic region in the present embodiment comprises an HTL 29 and an ETL 30. It is to be noted that the organic region in any case at least comprises one organic layer (see first embodiment, for example). The Si IC 25 might comprise integrated circuitry which is not illustrated in FIG. 5, for sake of simplicity. Instead of InN other group III nitrides might be used, for example.

InN is an excellent barrier layer material because it is a degenerate semiconductor which has both excellent transparency and is conductive, but not so conductive that lateral conduction through the InN barrier layer 27 between adjacent Al metal pads 26 on the Si IC 25 causes electrical crosstalk. InN having these properties can be deposited at or near room temperature as described in Beierlein et al., Materials Research Society Internet Journal of Nitride Semiconductor Research, Vol. 2, Paper 29. InN is also a convenient choice because its surface work function can be increased by oxidation thus forming an $InNO_x$ anode modification layer 28 directly on the InN barrier layer. Equivalently, the $InNO_x$ anode modification layer 28 could be directly deposited onto the InN.

Several methods of deposition of oxide-based anode modification layers are listed below:

chemical vapor deposition (CVD), including plasma-enhanced chemical vapor deposition (PECVD);

sputter deposition or reactive (e.g. in an oxygen environment) sputter deposition;

thermal evaporation;

electron-beam evaporation;

oxygen plasma (plasma-assisted oxidation);

thermal annealing in an oxidizing environment;

UV-ozone treatment;

wet-chemical oxidation;

electrochemical oxidation;

spin-coating from solution.

A completely different anode modification layer 28 could also be substituted, e.g. ITO, ZnO, MgO, $Sn_2O_3$, $In_2O_3$, $RuO_2$, or $V_2O_5$, or similar oxides, just to give some examples. Similarly, a completely different metal layer 26 could also be substituted. The degeneracy of the InN semiconductor insures that charge can pass easily from the metal layer 26 into the InN barrier layer 27, regardless of the composition or initial state of the metal layer 26 surface. For the same reason, charge can also traverse the InN barrier layer 27 and into the anode modification layer 28 without significant series resistance. The strength of the highly polar In—N bond insures that InN 27 acts as an excellent chemical and physical barrier to corrosion or diffusion between the metal layer 26 and the anode modification layer 28.

The device depicted in FIG. 5 benefits from the high reflectivity of the Al metal layer 26, and the low visible spectrum absorption of the InN barrier layer 27 and the $InNO_x$ anode modification layer 28, which permits much of the EL 32 emitted towards the substrate to be reflected back through the TC 31.

Devices having the anode structure depicted in FIG. 5 exhibit higher quantum and power efficiencies than comparable structures having conventional ITO anodes as a result of more balanced charge injection between the Al/InN/$InNO_x$ anode and the TC.

TABLE 2

Exemplary details of the second embodiment

| Layer | No. | Material | Thickness | present example |
|---|---|---|---|---|
| Substrate | 25 | Si IC | 0.05–1 mm | 500 µm |
| Metal Layer | 26 | Aluminum | 0.05–2 µm | 500 nm |
| Barrier Layer | 27 | InN | 0.01–1 µm | 20 nm |
| Anode modification Layer | 28 | $InNO_x$ | 0.001–1 µm | 5 mn |
| Hole Transport Layer | 29 | TAD | 10–200 nm | 50 nm |
| Electron Transport Layer | 30 | $Alq_3$ | 10–200 nm | 50 nm |
| Transparent Cathode | 31 | MgAg/ITO | 1–20 nm/ 10–1000 nm | 80 nm/ 50 nm |

A third embodiment of the inventive anode for TC OLEDs fabricated on Si substrates is depicted in FIG. 6. From the substrate 33 up, listed in the order of deposition, is a Si IC/Ni/$NiO_x$/$V_2O_5$/HTL/EML/ETL/TC OLED structure. The Si IC 33 in FIG. 6 comprises an Al:Cu alloy top metal contact 34 which serves as the metal layer in the inventive anode. After completion of the Si IC, a two layer Ni 35/$NiO_x$ 36 barrier layer is deposited in sequence directly onto those parts of the substrate 33 which are covered by the metal contact layer 34, or alternatively, the Ni 35 barrier layer is deposited, and its surface is subsequently oxidized to form the $NiO_x$ 36 barrier layer. The inventive anode is completed by the deposition of the $V_2O_5$ anode modification layer 37 capable of injecting holes into the HTL 38. Electrons injected into the ETL 40 from the TC 41 recombine in the organic emission layer 39 producing EL 42 which is extracted through the TC 41. The circuitry in the Si substrate is not shown for simplicity.

We note that an arbitrarily large number of barrier layers 35, 36 can be inserted between the metal layer 34 and the anode modification layer 37 of the inventive anode provided that they do not reduce device efficiency through excessive series resistance at their interfaces or in their bulk. The Ni 35/$NiO_x$ 36 barrier layer structure of the present embodiment relies on the high reflectivity of the Ni 35 metal and the transparency and thinness of the insulating $NiO_x$ 36 layer to insure good device efficiency.

We note that the third embodiment without the Ni and $NiO_x$ layers is unstable due to a chemical reaction between the Al:Cu alloy 34 and the anode modification layer 37. The oxidation of the Ni 35 surface, or alternatively the deposition of an additional barrier layer further chemically isolates the Ni metal from the anode modification layer 37. Because the Ni 35 barrier layer is highly conductive, it must be very thin, or patterned (as shown in FIG. 6) to avoid lateral conduction between adjacent IC metallizations 34 (not shown in FIG. 6).

Devices having the inventive metal/Ni/$NiO_x$/$V_2O_5$ anode structure depicted in FIG. 6 exhibit steeper current/voltage characteristics than conventional ITO anodes and similar power efficiencies.

TABLE 3

Exemplary details of the third embodiment

| Layer | No. | Material | Thickness | present example |
|---|---|---|---|---|
| Substrate | 33 | Si IC | 0.05–5 mm | 500 μm |
| Metal Layer | 34 | Al-Cu | 0.05–5 μm | 500 nm |
| Barrier Layer | 35 | Ni | 0.1–1000 nm | 2.5 nm |
| Barrier Layer | 36 | NiO$_x$ | 0.1–10 nm | 1 nm |
| Anode modification layer | 37 | V$_2$O$_5$ | 0–1 μm | 5 nm |
| Hole Transport Layer | 38 | NPB | 10–200 nm | 50 nm |
| Emission Layer | 39 | Alq$_3$: Rubrene | 1–100 nm | 15 nm |
| Electron Transport Layer | 40 | Alq$_3$ | 10–200 nm | 50 nm |
| Transparent Cathode | 41 | Ca/InGaN/ ITO | 1–20 nm/ 10–100 nm/ 10–1000 nm | 10 nm/ 80 nm/ 150 nm |

In the following, some display embodiments, based on and enabled by the present invention, are addressed.

Any of the three embodiments, or modifications thereof, can be part of a display or array. The Si substrate, for example, might comprise integrated circuitry which drives the pixels of the OLEDs formed thereon. For this purpose, the inventive anode might be connected to the metal contact of an active matrix element formed in the Si IC substrate. If the circuitry is patterned appropriately, individual pixels or groups of pixels can be turned on and off.

Arrays and displays can be realized with high quantum and power efficiencies, lower threshold voltages, and/or steep current/voltage characteristics. The inventive anode is compatible with many known approaches.

It is advantageous to integrate OLEDs onto Si substrates because prior to OLED deposition, the substrate can be fabricated to contain the active Si devices, such as for example an active matrix, drivers, memory and so forth. Such an OLED on Si structure can be a very inexpensive small area organic display with high resolution and performance. An OLED or OLED array may either be grown directly on such a Si substrate carrying Si devices, or it may be fabricated separately and assembled in a flip-chip fashion onto the Si circuitry later.

One problem is that the Si metallization is typically Al or an Al alloy which are poor OLED anode or cathode materials. The inventive anode permits a stable, low voltage hole contact to be formed on top of the standard Si process metallizations.

In the following some examples of the different organic materials which can be used are given.

Electron Transport/Emitting Materials

Alq$_3$, Gaq$_3$, Inq$_3$, Scq$_3$, (q refers to 8-hydroxyquinolate or it's derivatives) and other 8-hydroxyquinoline metal complexes such as Znq$_2$, Beq$_2$, Mgq$_2$, ZnMq$_2$, BeMq$_2$, BAlq, and AlPrq$_3$, for example. These materials can be used as the ETL or emission layer.

Other classes of electron transporting materials are electron-deficient nitrogen-containing systems, for example oxadiazoles like PBD (and many derivatives), and triazoles, for example TAZ (1,2,4-triazole).

These functional groups can also be incorporated in polymers, starburst and spiro compounds. Further classes are materials containing pyridine, pyrimidine, pyrazine and pyridazine functionalities.

Finally, materials containing quinoline, quinoxaline, cinnoline, phthalazine and quinaziline functionalities are well known for their electron transport capabilities.

Other materials are didecyl sexithiophene (DPS6T), bis-triisopropylsilyl sexithiophene (2D6T), azomethin-zinc complexes, pyrazine (e.g. BNVP), styrylanthracene derivatives (e.g. BSA-1, BSA-2), non-planar distyrylarylene derivatives, for example DPVBi (see C. Hosokawa and T. Kusumoto, International Symposium on Inorganic and Organic Electroluminescence 1994, Hamamatsu, 42), cyano-substituted-polymers such as cyano-PPV (PPV means poly(p-phenylenevinylene)) and cyano-PPV derivatives.

The following materials are particularly well suited as Emission Layers and Dopants Anthracene, pyridine derivatives (e.g. ATP), Azomethin-zinc complexes, pyrazine (e.g. BNVP), styrylanthracene derivatives (e.g. BSA-1, BSA-2), Coronene, Coumarin, DCM compounds (DCM1, DCM2), distyryl arylene derivatives (DSA), alkyl-substituted distyrylbenzene derivatives (DSB), benzimidazole derivatives (e.g. NBI), naphthostyrylamine derivatives (e.g. NSD), oxadiazole derivatives (e.g. OXD, OXD-1, OXD-7), N,N,N',N'-tetrakis(m-methylphenyl)-1,3-diaminobenzene (PDA), perylene and perylene derivatives, phenyl-substituted cyclopentadiene derivatives, 12-phthaloperinone sexithiophene (6T), polythiophenes, quinacridones (QA) (see T. Wakimoto et al., International Symposium on Inorganic and Organic Electroluminescence, 1994, Hamamatsu, 77), and substituted quinacridones (MQA), rubrene, DCJT (see for example: C. Tang, SID Conference San Diego; Proceedings, 1996, 181), conjugated and non-conjugated polymers, for example PPV and PPV derivatives, dialkoxy and dialkyl PPV derivatives, for example MEH-PPV (poly(2-methoxy)-5-(2'-ethylhexoxy)-1,4-phenylene-vinylene), poly(2,4-bis(cholestanoxyl)-1,4-phenylene-vinylene) (BCHA-PPV), and segmented PPVs (see for example: E. Staring in International Symposium on Inorganic and Organic Electroluminescence, 1994, Hamamatsu, 48, and T. Oshino et al. in Sumitomo Chemicals, 1995 monthly report).

Hole Transport Layers and Hole Injection Layers

The following materials are suited as hole injection layers and hole transport layers. Materials containing aromatic amino groups, like tetraphenyldiaminodiphenyl (TPD-1, TPD-2, or TAD) and NPB (see C. Tang, SID Meeting San Diego, 1996, and C. Adachi et al. Applied Physics Letters, Vol. 66, p. 2679, 1995), TPA, NIPC, TPM, DEH (for the abbreviations see for example: P. Borsenberger and D. S. Weiss, Organic Photoreceptors for Imaging Systems, Marcel Dekker, 1993). These aromatic amino groups can also be incorporated in polymers, starburst (for example: TCTA, m-MTDATA, see Y. Kuwabara et al., Advanced Materials, 6, p. 677, 1994, Y. Shirota et al., Applied Physics Letters, Vol. 65, p. 807, 1994) and spiro compounds.

Further examples are: Copper(II) phthalocyanine (CuPc), (N,N'-diphenyl-N,N'-bis-(4-phenylphenyl)-1,1'-biphenyl-4,4'-diamine), distyryl arylene derivatives (DSA), naphthalene, naphthostyrylamine derivatives (e.g. NSD), quinacridone (QA), poly(3-methylthiophene) (P3MT) and its derivatives, perylene and perylene derivatives, polythiophene (PT), 3,4,9,10-perylenetetracarboxylic dianhydride (PTCDA), PPV and some PPV derivatives, for example MEH-PPV, poly(9-vinylcarbazole) (PVK), discotic liquid crystal materials (HPT).

There are many other organic materials known as being good light emitters, charge transport materials, and charge injection materials, and many more will be discovered. These materials can be used as well for making light emitting structures according to the present invention. More information on organic materials can be found in text books and other well known publications, such as the book "Inorganic and Organic Electroluminescence", edited by R. H. Mauch et al., Wissenschaft und Technik Verlag, Berlin, Germany, 1996, and the book "1996 SID International Symposium, Digest of Technical Papers", first edition, Vol. XXVII, May 1996, published by Society for Information Display, 1526 Brookhollow Dr., Suite 82, Santa Ana, Calif., USA.

Additionally, blend (i.e. guest-host) systems containing active groups in a polymeric binder are also possible. The concepts employed in the design of organic materials for OLED applications are to a large extent derived from the extensive existing experience in organic photoreceptors. A brief overview of some organic materials used in the fabrication of organic photoreceptors is found in the above mentioned publication of P. Brosenberger and D. S. Weiss, and in Teltech, Technology Dossier Service, Organic Electroluminescence (1995), as well as in the primary literature.

OLEDs have been demonstrated using polymeric, oligomeric and small organic molecules. The devices formed from each type of molecule are similar in function, although the deposition of the layers varies widely. The present invention is equally valid in all forms described above for organic light emitting devices based on polymers, oligomers, or small molecules.

Small molecule devices are routinely made by vacuum evaporation. This is compatible with the process used for the formation of the inventive anode.

Evaporation can be performed in a Bell jar type chamber with independently controlled resistive and electron-beam heating of sources. It can also be performed in a molecular beam deposition system incorporating multiple effusion cells and sputter sources. Oligomeric and polymeric organics can also be deposited by evaporation of their monomeric components with later polymerization via heating or plasma excitation at the substrate. It is therefore possible to copolymerize or create mixtures by co-evaporation.

In general, polymer containing devices (single layer, multilayer, polymer blend systems, etc.) are made by dissolving the polymer in a solvent and spreading it over the substrate either by spin coating or the doctor blade technique. After coating the substrate, the solvent is removed by evaporation or otherwise. This method allows the fabrication of well defined multilayer organic stacks, provided that the respective solvents for each subsequent layer do not dissolve previously deposited layers.

Additionally, hybrid devices containing both polymeric and evaporated small organic molecules are possible. In this case, the polymer film is generally deposited first, since evaporated small molecule layers often cannot withstand much solvent processing.

What is claimed is:

1. An organic electroluminescent device comprising an anode, a cathode, and an organic region sandwiched between said anode and said cathode, said anode further comprising:
    a metal layer,
    a barrier layer, and
    an anode modification layer,
    wherein said anode is arranged such that said anode modification layer is in contact with said organic region and light is emitted through said cathode.

2. The device of claim 1, wherein the surface of the barrier layer is oxidized to form the anode modification layer.

3. The device of claim 1, wherein the anode modification layer is deposited onto the barrier layer.

4. The device of claim 1, wherein the barrier layer comprises a group III nitride.

5. The device of claim 1, wherein the group III nitride is InN.

6. The device of claim 1, wherein the metal layer comprises Al or Cu.

7. The device of claim 1, wherein the anode modification layer has a high workfunction.

8. The device of claim 1, wherein the metal layer comprises metal which provides visible spectrum reflectivity to increases the amount of light extracted through said cathode.

9. The device of claim 1, wherein the anode modification layer and/or the barrier layer strongly absorb visible light.

10. The device of claim 1, wherein the metal layer comprises a metal selected from the group consisting of Al, Cu, Mo, Ti, Pt, Ir, Ni, Au, and Ag.

11. The device of claim 1, wherein the metal layer comprises an alloy of a metal, said metal being selected from the group consisting of Al, Cu, Mo, Ti, Pt, Ir, Ni, Au and Ag.

12. The device of claim 1, wherein the metal layer comprises a stack of a first metal over a second metal, said first and second metals being selected from the group consisting of Al, Cu, Mo, Ti, Pt, Ir, Ni, Au and Ag.

13. The device of claim 1, wherein the metal layer is formed on a substrate.

14. The device of claim 13, wherein the substrate is a silicon substrate.

15. The device of claim 14, wherein the silicon substrate is crystalline.

16. The device of claim 13, wherein the substrate comprises polysilicon circuitry or amorphous circuitry.

17. The device of claim 14, wherein the silicon substrate comprises integrated circuitry.

18. The device of claim 1, wherein the anode modification layer is adapted to provide efficient hole injection into the organic region.

19. The device of claim 1, wherein the anode modification layer is adapted to form a stable interface with the organic region.

20. The device of claim 1, wherein the anode modification layer is conductive or insulating.

21. The device of claim 1, wherein an oxide layer serves as anode modification layer.

22. The device of claim 1, wherein the barrier layer physically and chemically isolates the anode modification layer from the metal layer by forming a barrier, while permitting charge to pass through its interfaces with the metal layer and anode modification layer.

23. The device of claim 1, wherein the barrier layer is conductive or insulating.

24. The device of claim 1, wherein the barrier layer is highly reflective.

25. The device of claim 1, wherein the anode modification layer comprises an oxide selected from the group consisting of ITO, ZnO, MgO, $Sn_2O_3$, $In_2O_3$, $RuO_2$, and $V_2O_5$.

26. The device of claim 1, wherein the barrier layer comprises a Ni layer and a $NiO_x$ layer, and the anode modification layer comprises $V_2O_5$.

27. A display apparatus comprising a substrate and an array of organic electroluminescent devices formed on said substrate, each one of said organic electroluminescent devices comprising an anode, a cathode and an organic region sandwiched between said anode and said cathode, said anode further comprising a metal layer, a barrier layer, and an anode modification layer, wherein said anode is arranged such that said anode modification is in contact with said organic region and light is emitted through said cathode.

28. The display apparatus of claim 27, wherein said substrate is a silicon substrate.

29. The display apparatus of claim 28, wherein circuitry is integrated into the substrate.

30. The display apparatus of claim 29, wherein the circuitry is adapted to drive the device.

31. The display apparatus of claim 27, wherein said anode is patterned.

32. A method for making an organic electroluminescent device comprising an anode, a cathode, and an organic region being sandwiched between said anode and said cathode, said method comprising a step of building up said anode prior to the formation of said organic region and cathode, by forming a metal layer, a barrier layer situated on the metal layer, and an anode modification layer situated on the barrier layer, said anode being arranged such that said anode modification layer is in contact with said organic region and light is emitted through said cathode.

33. The method of claim 32, wherein an oxide serves as said anode modification layer, said oxide being formed by oxidizing the surface of the barrier layer.

34. The method of claim 32, wherein the anode modification layer is formed by deposition thereof onto the barrier layer.

* * * * *